(12) United States Patent  
Jo

(10) Patent No.: US 9,397,291 B1  
(45) Date of Patent: Jul. 19, 2016

(54) RRAM WITH DUAL MODE OPERATION

(71) Applicant: Crossbar, Inc., Santa Clara, CA (US)

(72) Inventor: Sung Hyun Jo, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 14/802,477

(22) Filed: Jul. 17, 2015

Related U.S. Application Data

(62) Division of application No. 13/969,130, filed on Aug. 16, 2013, now Pat. No. 9,118,007.

(60) Provisional application No. 61/785,953, filed on Mar. 14, 2013.

(51) Int. Cl.
```
G11C 13/00      (2006.01)
H01L 45/00      (2006.01)
H01L 27/24      (2006.01)
```

(52) U.S. Cl.  
CPC .......... *H01L 45/145* (2013.01); *H01L 27/2409* (2013.01); *H01L 27/2436* (2013.01); *H01L 45/1233* (2013.01); *H01L 45/1253* (2013.01); *G11C 13/0004* (2013.01); *G11C 13/0007* (2013.01); *G11C 13/0069* (2013.01)

(58) Field of Classification Search  
CPC .......... G11C 13/0069; G11C 13/0004; G11C 13/0007  
USPC ............................................. 365/148, 185.05  
See application file for complete search history.

(56) References Cited

U.S. PATENT DOCUMENTS

2007/0165442 A1   7/2007   Hosoi et al.  
2011/0310656 A1*  12/2011  Kreupl ................. G11C 11/16  
                                                365/148

OTHER PUBLICATIONS

Office Action dated Nov. 17, 2014 for U.S. Appl. No. 13/969,130, 11 pages.  
Notice of Allowance dated Apr. 16, 2015 for U.S. Appl. No. 13/969,130, 34 pages.

* cited by examiner

*Primary Examiner* — Jason Lappas  
(74) *Attorney, Agent, or Firm* — Amin, Turocy & Watson, LLP

(57) ABSTRACT

A two-terminal memory cell comprises a dual mode of operation in a unipolar mode and bipolar mode for a programming or On-state and for an erase or Off-state of the cell. The two-terminal memory cell is field programmable and can be flexibly designed or integrated into existing architecture. The two-terminal memory comprises a first electrode layer and a second electrode layer with a switching layer disposed between that has an electrical insulator material. A semiconductor layer is disposed between the switching layer and at least one of the first electrode or the second electrode. The switching layer generates a conductive path that is configured to be in a program state and an erase state, based on a bipolar mode and a unipolar mode.

20 Claims, 10 Drawing Sheets

RRAM WITH DUAL MODE OPERATION

CROSS-REFERENCE TO RELATED APPLICATION(S)

The subject application for patent is a division of U.S. patent application Ser. No. 13/969,130 entitled "RRAM WITH DUAL MODE OPERATION" and filed Aug. 16, 2013, which claims the benefit of priority to U.S. Provisional Patent Application No. 61/785,953 entitled "RRAM WITH DUAL MODE OPERATION" and filed Mar. 14, 2013, the disclosures of which are incorporated by reference herein in their respective entireties and for all purposes.

TECHNICAL FIELD

This disclosure generally relates to semiconductor electronics and materials, and more particularly to resistive random access memory with dual mode operation.

BACKGROUND

Resistive switching elements can operate as viable alternatives to various memory cell technologies, such as metal-oxide semiconductor (MOS) type memory cells employed for electronic storage of digital information. Models of resistive-switching memory devices provide some potential advantages over non-volatile FLASH MOS type transistors, including smaller die size, higher memory density, faster switching (e.g., from a relatively conductive state to a relatively non-conductive state, or vice versa), good data reliability, low manufacturing cost, and other advantages.

In particular, resistive random access memory (RRAM) can hold substantial advantages over competing technologies in the semiconductor electronics industry, such as for high density non-volatile storage. An RRAM device has an insulator layer that is provided between a pair of electrodes and exhibits electrical pulse induced hysteretic resistance switching effects. Filaments can be formed between the electrodes by a diffusion and (or) drift of ions that reduce or increase the resistance of the structure and remain after being induced, in which gives the device a non-volatile characteristic in a programmed state. The ions can then be removed and the cell be in an erase state by a reverse flow of the ions, and thus, enable a controllable resistive nature. However, the RRAM devices are manufactured to operate in either a unipolar modality or in a bipolar modality for programming and erasing.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Apparatuses disclosed herein relate to an electronic device comprising an electronic memory unit, the electronic memory unit comprising one or more two-terminal multi-state memory cells configured to store information. Further, the two-terminal multi-state memory cells can comprise a pair of electrodes respectively configured to conduct a current at a first electrical resistance and an insulating switching medium positioned between the pair of electrodes and configured to conduct the current at a second electrical resistance that is different than the first electrical resistance. Moreover, the two-terminal multi-state memory cells can comprise a conductive filament configured to form and to rupture within at least a portion of the insulating switching medium in response to a bipolar mode of operation and in response to a unipolar mode of operation, wherein the conductive filament, when formed, causes the insulating switching medium to conduct the current at less than the second electrical resistance, and wherein the conductive filament, when ruptured, causes the insulating switching medium to conduct the current at substantially the second electrical resistance.

In another aspect, there is provided a method for programming a memory cell. The method can comprise activating a memory cell of an array of memory cells. Further, the method can comprise receiving a selection indicative of a program mode, the program mode selected from a group consisting of: a unipolar program mode and a bipolar program mode. The method can additionally comprise at least one of: applying a first stimulus to the memory cell in response to the selection being indicative of the bipolar mode, the first stimulus being configured to program the memory cell from a high resistance state to a low resistance state; or applying a second stimulus to the memory cell in response to the selection being indicative of the unipolar mode, the second stimulus being configured to program the memory cell from the high resistance state to a second low resistance state.

Further memory devices, apparatuses, or methods of fabricating or operating disclosed memory devices will be evident from the detailed description, associated drawings or appended claims.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout, and in which.

DETAILED DESCRIPTION

Figure 1A:
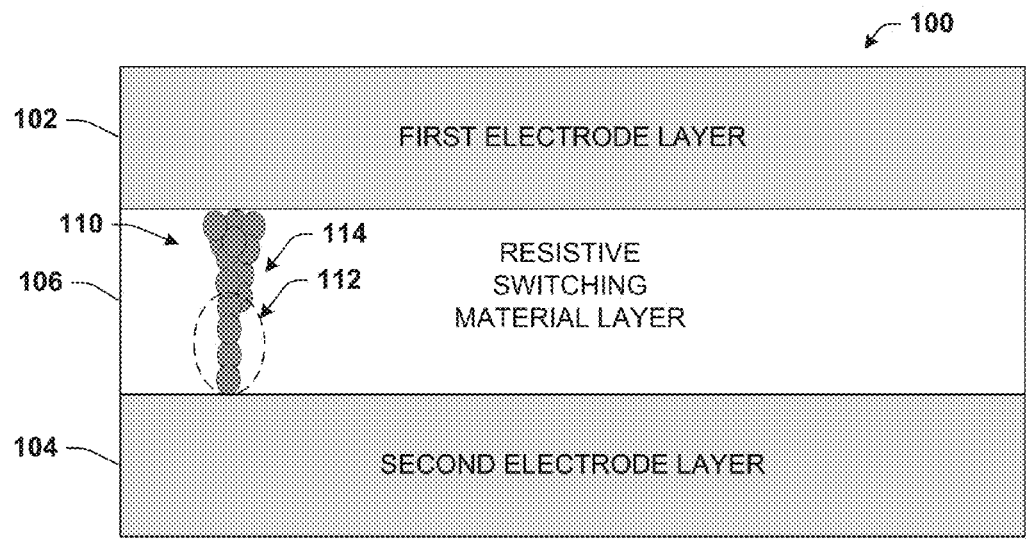
FIG. 1A illustrates a block diagram of an example of a memory cell that exhibits dual mode of operation in accordance with certain embodiments of this disclosure.

This disclosure relates to memory cells, and, in particular resistive switching memory cells, such as resistive switching two-terminal memory cells, in various embodiments. The resistive switching two-terminal memory cells (also referred to as resistive switching memory cells), as utilized herein, comprise circuit components having two electrical contacts (also referred to herein as electrodes or terminals) with an active region between the two conductive contacts. The active region of the two-terminal memory device exhibits a plurality of stable or semi-stable resistive states, each resistive state having different electrical resistance, which can be retained and re-programmed within the cell. Moreover, respective ones of the plurality of states can be formed or activated in response to a respective voltage difference applied at the two conductive contacts. An example of a resistive switching two-terminal memory device, though not exhaustive, can include a resistive random access memory (RRAM).

Various types of resistive switching memory cells are envisioned as having various types of switching mediums, such as layered amorphous silicon (a-Si), metal oxides and silicon oxides, as well as other materials. Resistive-switching devices can have, for example, a three-layer arrangement of metal/insulator/metal, which can include a-Si resistive switching device having a metal/a-Si/metal arrangement. The a-Si layer essentially serves as a digital information storage medium, and can also be referred to as a resistive switching layer (RSL), resistive switching medium (RSM), a switching medium, an inducting switching medium, or the like. The insulator layer or switching medium layer, as referred to herein, can include other materials as well, such as oxides, solid electrolyte materials, etc.

Resistive-switching memory can include, for example, a filamentary-based memory cell, which in turn can include: a p-type or n-type silicon bearing layer (e.g., p-type or n-type polysilicon, p-type or n-type SiGe), an undoped silicon bearing layer (e.g., having intrinsic characteristics), and an active metal layer for providing filament forming ions to the amorphous silicon layer (e.g., silver (Ag), copper (Cu), gold (Au), titanium (Ti), nickel (Ni), aluminum (Al), chromium (Cr), iron (Fe), manganese (Mn), tungsten (W), vanadium (V), cobalt (Co), platinum (Pt), and palladium (Pd)). In some disclosed embodiments, a memory cell can comprise one or more of the foregoing layers, a subset of these layers, or none of these layers, or other layers detailed herein.

Two-terminal memory cells have several advantages. For instance, resistive-switching memory technology can generally be smaller, typically consuming silicon area on the order of $4F^2$ per adjacent resistive-switching device (e.g., a memory cell comprising two resistive-switching devices would therefore be approximately $8F^2$ if constructed in adjacent silicon space) where F stands for the minimum physical feature size of a specific technology node. Non-adjacent resistive-switching devices, e.g., stacked above or below each other, can consume as little as $4F^2/n$ for a set of multiple non-adjacent devices where n is the number of stacked memory layers. Such can lead to greater semiconductor component density and memory density, and low manufacturing costs for a given number of transistors relative to competing technologies. Resistive-switching memory also has very fast programming or switching speed along with a relatively low programming current. Additionally, resistive-switching memory is non-volatile memory, having the capacity to store data without continuous application of power.

To program a filamentary-based resistive switching memory cell, a suitable program voltage can be applied across the memory cell causing a conductive path or a filament to form through a resistive, or dielectric, portion of the memory cell, in which the cell becomes in a program state. This causes the memory cell to switch from a relatively high resistive state, to a relatively low resistive state. An erase process can be implemented to reverse the process, at least in part, causing the conductive path or filament to rupture and the memory cell to return to the high resistive state from the low resistive state. This change of state, in the context of memory, can be associated with respective states of a binary bit. Accordingly, multiple such memory cells can be programmed or erased to represent respective zeroes or ones of binary information, and by retaining those states over time, can in effect facilitate storing binary information. In various embodiments, multi-level information (e.g., multiple bits) may be stored in such memory cells. For various reasons, two-terminal memory cells are generally quick to program and responsive, changing state readily in response to a program voltage, which is a significant advantage of resistive-switching memory cells over other memory cell technologies.

The memory cells disclosed herein can have a variety of different resistive switching cell technologies. For example, the different technologies can include different discrete programmable resistances, different associated program/erase voltages, as well as other differentiating characteristics. In one embodiment, the memory cells can be both unipolar and bipolar resistive-switching memory cells, enabling them to be field programmable. A unipolar resistive-switching memory cell by itself is unipolar because the cell is in a program state and in an erase state based on one or more electrical signals that are of the same polarity. The unipolar resistive-switching memory cell is both programmed and erased from electrical signals that comprise either a positive polarity or a negative polarity. For example, a unipolar resistive-switching memory cell, once initially programmed, can be later erased in response to a first positive voltage (e.g., three volts) and programmed in response to a second positive voltage (e.g., between four and five volts). Bipolar resistive-switching memory cells, on the other hand, are in a program state and in an erase state based on electrical signals that are of different polarities. For example, the bipolar resistive-switching memory cells can become programmed in response to a positive voltage and erased in response to a negative voltage.

Overview

In one aspect of the present disclosure, a two-terminal memory cell (e.g., an RRAM cell) is fabricated and operated with both unipolar and bipolar modalities, which serves for significant advantages in the field by offering flexibility to operational design and an upgrade to existing infrastructure. The memory cells are field programmable memory cells that can be individually programmed as a unipolar resistive-switching memory cell and as a bipolar resistive-switching memory cell.

In one or more disclosed embodiments, there is provided a two-terminal memory cell that can comprise a pair of electrodes that include a first electrode and a second electrode. The first electrode (e.g., a top electrode) can comprise ions that are at least in part mobile from an applied or dynamic force into a switching layer to form a conductive path or filament. The first electrode can be located adjacent a first surface of the switching layer, and a semiconductor layer can be located adjacent to a second surface of the switching layer, which can be opposite to the first surface. A second electrode layer can be located proximate to the second surface of the switching layer and the semiconductor layer. The switching layer is configured to generate a conductive path that has a program state and an erase state, based on a bipolar mode and a unipolar mode of operation. The bipolar mode is configured to generate the program state and the erase state of the conductive path based on electrical signals that have inverse polarities, and the unipolar mode is configured to generate the program state and the erase state of the conductive path based on at least one absolute magnitude of the electrical signals.

In another aspect, the field programmable memory cell induces filament formation and forms a conductive path through the switching medium when the cell is in a program state, and ruptures the conductive path, thereby increasing the resistance of the cell, when in an erase state. When operating in the bipolar mode, the ions formulate the conductive path through the switching medium based on vector field effects (e.g., an electric field), in which a directional or polar field forces ions to repel from the electrode into the switching medium (program state) and an opposite polar field pulls the ions back to cause a filament rupture (erase state). When in the unipolar mode, the ions formulate the conductive path in response to Joule heating (ohmic heating) effects caused by an electrical breakdown of the switching layer and rupture the conductive path based on vector field effects. Therefore, the memory cell operates to eliminate, reduce or mitigate the amount of Joule heating (ohmic heating) utilized for the erasing operations of memory cells that are only unipolar.

Non-Limiting Examples of RRAM Cell with Dual Mode Operation

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring initially to FIG. 1A, apparatus 100 is depicted. A memory cell 100 can be a p-type resistive random access memory (RRAM) cell 100 that comprises a dual mode of operation. For example, the RRAM cell 100 can initially be in an Off-state (erase state) and highly resistive to current between electrodes. The cell 100 is programmed in an On-state (program state) to form a conductive path that decreases resistivity to a desired or a programmed degree. The programming of the cell can be a result of a polar electrical signal, such as a positive voltage introduced at one of the electrodes, which, in turn, induces an electric field that repels ions from the electrode into a switching medium. The cell 100 can also be programmed by a negative voltage that causes an electrical breakdown of the switching medium, which causes Joule heating. Further, the cell 100 can be erased to the Off-state by rupturing the filament formed within the cell 100 with a negative electrical signal by pulling ions back by the electrical field in both modes (unipolar and bipolar mode), which can be selected in the field for operation. The memory cell 100 provides an advantage in being able to erase predominately by the electric field in both modes of operation, which eliminates reliability issues resulting from Joule heating based erase operations that can predominate in memory cells with only a unipolar mode of operation. The cell 100 is configured then to be programmed and erased based on a unipolar mode and a bipolar mode of operation.

The memory cell 100 can include a plurality of electrodes that can comprise a first (second) electrode layer 102 and a second (first) electrode layer 104, which can represent a pair of electrodes from top (bottom) to bottom (top), respectively, or electrodes arranged in different configurations than the present example, such as from left to right or right to left (not shown). Between these two electrodes, a resistive switching material layer 106, or a switching layer having an insulator switching medium, can reside adjacent to the first (top) electrode layer 102.

The first electrode layer 102 can comprise a conductive metal, which can be ionized (oxidized) under an electric field or heat. The conductive ions can be capable of leaving a boundary of the first electrode layer 102 in response to an applied electrical signal that can induce a vector field, such as an electric field of suitable magnitude, for example. These conductive ions, upon leaving first electrode layer 102 and entering another entity (e.g., the resistive switching material layer 106) can tend to alter electrical characteristics of the other entity. Particularly, these conductive ions can serve to increase conductivity of the other entity, at least within a vicinity of the displaced ions. Suitable materials for first electrode layer 102 can vary. One example is silver, also referred to herein in its periodic table form Ag as part of an active metal portion (not shown) of the first electrode layer 102. Another example can include copper (e.g., Cu), and still other examples can include compounds of silver or copper, or the like, or a suitable combination thereof.

The memory cell 100 can be placed in an On-state (a program state) by applying an electrical signal, such as a program voltage Vp to the first electrode layer 102 that is larger than a threshold (e.g., 2~6V). Because the memory cell 100 is configured with a dual mode of operation, the cell 100 can operate as a unipolar memory cell and as a bipolar memory cell. The program voltage Vp can be a negative or a positive bias to satisfy the threshold signal level and operate to be programmed with both unipolar and bipolar voltages. In a bipolar mode, a vector field such as an electric field operates to drive the active metal (e.g., Ag) of the first electrode layer 102 to the switching layer 106, forming a conducting filament, or a conductive path 110. In a unipolar mode, a large bias that exceeds a threshold level operates to cause electrical breakdown of the switching layer 106 to cause a localized effect, in which current density rises and the local heat injects the active metal ions from the first electrode layer 102 into the switching layer 106, forming the conductive path 110. During the programming, current compliance can be further applied to the cell 100 to limit an excess of heating.

As stated above, the conductive path 110 can be formed within switching medium 106 in response to a suitable electric signal (e.g., an electric field or voltage, a current, and so forth) applied to the device. The electric signal applied across the switching medium 106 can induce a diffusion or drift of ions (e.g., metal ions) from the first electrode layer 102 toward the second electrode layer 104, or vice versa, from the second electrode layer 104 toward the first electrode layer 102, based on a location of an electro deposition, or other process parameters. In certain implementations, the conductive path 110 can be formed in multiple steps, the application of different electric signals for different regions within the conductive path 110, resulting in a stable region 114 and a semi-stable region 112 of the conductive path 110 as opposed to a single step with a more uniform conductive path 110 resulting.

The switching medium layer 106 can be comprised of various materials and various layers of material, as discussed in detail below. For example, the switching medium layer 106 can be any suitable material or switching medium having high electrical resistance and having at least partial permeability (e.g., in response to an electric signal) to ions of the first electrode layer 102 or ions that are generated within the switching medium (e.g., metal or oxygen ions). In addition, the material employed for electrically resistive switching medium layer 106 can be compatible with semiconductor fabrication processes (e.g., stacking, etching, masking, deposition, etc.). Examples of such a material can include an amorphous silicon (a-Si) material, a chalcogenide, a silicon on glass, an oxide such as titanium oxide (TiOx), tantalum oxide (TaOx), silicon dioxide (e.g., $SiO_2$), silicon sub-oxide (e.g. SiOx), Hafnium Oxide ($HfO_x$), Nickel Oxide ($NiO_x$), Tungsten Oxide ($WO_x$), Aluminum Oxide ($AlO_x$), Copper Oxide ($CuO_x$), Germanium Oxide ($GeO_x$), Silicon Germanium Oxide ($Si_xGe_yO_z$), Silicon Oxi-Nitride ($SiO_xN_y$), Silver Germanium Selenide ($Ag_xGe_ySe_z$), Silver Selenide ($Ag_2Se$), Copper Sulfite ($Cu_2S$), other oxide, or a suitable combination thereof, which is at least in part porous with respect to the particles, ions or the like. In various aspects of the subject disclosure, the switching medium 106 can be less than a hundred nanometers in thickness. In particular aspects, the switching medium 106 can be about a fifty nanometers (nm) in thickness, or less. In at least one aspect, electrically resistive diffusive layer 106 can be selected from between about ten nanometers thick and about two nanometers thick or less.

The second electrode layer 104 can be a suitable metal conductor for a memory cell. Examples can include aluminum, copper, tungsten, titanium, silver, platinum, palladium, other suitable compounds thereof, or a suitable combination of the foregoing. In at least one aspect, metal electrode layer 104 can be a metal bitline, metal wordline, metal dataline, etc. of a memory array. For instance, metal electrode layer 104 can be a metal bitline or metal wordline in a fundamental crossbar memory array. The second electrode layer 104 can be connected to a sensing circuit (e.g., CMOS circuitry, not depicted) to measure current or voltage of cell 100 in conjunction with reading a state of cell 100, for example.

Figure 1B:
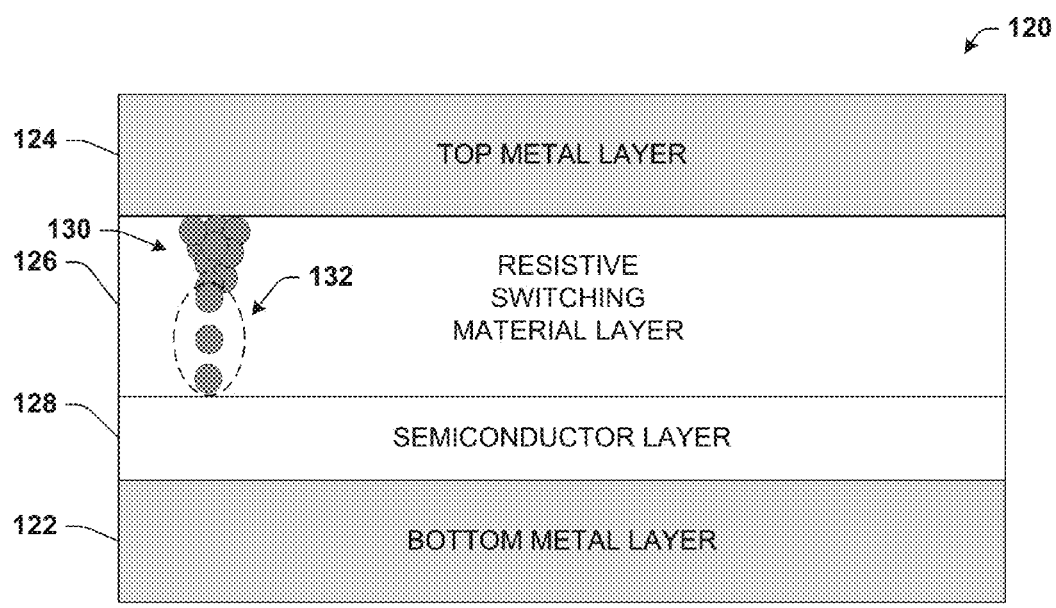
FIG. 1B illustrates a block diagram of another example of a memory cell that exhibits dual mode of operation in accordance with certain embodiments of this disclosure.

Referring to FIG. 1B, memory cell 120 represents a different, though similar, embodiment. In particular, memory cell 120 can include a bottom metal layer 122, top metal layer 124, resistive switching material layer 126, and a semiconductor layer 128, with the top metal layer 124 corresponding to the first metal layer 102 of FIG. 1A and the bottom metal layer 122 corresponding to the second metal layer 104 of FIG. 1A, in which the convention for referencing the electrodes discussed in this disclosure can be representative of different configurations other than a vertically configured cell having a top-bottom vertical stack. Additional details, characteristics, or aspects associated with the layers 104-106 and similar layers 122-128 are detailed in connection with like elements of FIGS. 1A-1B. The cell 120 further comprises a semiconductor layer 128 that can further include one or more different layers including a resistive layer for controlling an On-state current or an ohmic contact layer, for example. It is understood that the disclosed subject matter can be applicable to both p-type and n-type doped semiconductors. Hence, although most of the examples included herein relate to a p-type embodiment, it is understood that other embodiments can exist that are fashioned with n-type.

The memory cell 120 includes a conductive path 130 that is in an erase state or Off-state, as opposed to the conductive path 110 in FIG. 1A that is in the program state or On-state. To erase the memory cell 100 or 120 from the program state to the erase state, a negative electrical signal such as a negative bias that is larger than a threshold (e.g., $-2\sim-6V$) can be applied to the first electrode layers 102, 124, which in turn generates a vector field (e.g., an electric field) that operates to pull back the injected metal particles or ions, rupturing the conductive path 110 when in the bipolar mode of operation and when in the unipolar mode of operation. When in the bipolar mode of operation, for example, in which the program signal (e.g., Vp) is an opposite polarity to the erase signal, (either negative or positive, but not the same), the conductive path 130 becomes ruptured at one or more ruptured regions 132 by way of the opposite forces that formed the conductive path (e.g., conductive path 110). Rather, than the unbound or loosely bound conductive ions capable of leaving a boundary of the top metal layer 124 or the first electrode layer 102 in response to an applied electrical signal via an induced vector field, the ions instead are attracted back to the top metal layer 124 or the first electrode layer 102, rupturing the conductive path 132 formed and increasing the resistance of the cell 100, 120. The same electric field forces predominate for rupturing the conductive filament in the unipolar mode of operation also.

In one aspect, the memory cell 120 comprises a dual mode of operation as a bipolar cell and a unipolar cell. The program voltage Vp can be a negative or a positive bias to satisfy the threshold signal level and operate to be programmed with both unipolar and bipolar signals. In a bipolar mode, a vector field such as an electric field can operate to attract the active metal (e.g., Ag) to the first electrode layer 102 from the switching layer 106, rupturing the conducting filament, or the conductive path 130 at the ruptured region 132, which occurs due to the opposite polarity that enabled formation of the conductive path 110, 130. In the unipolar mode, a large bias that exceeds a threshold level, which can be smaller than the program bias or for the program state, operates to also cause an electric field to pull back the injected metal particles, rupturing the conductive filament 110, 130. Unlike devices or memory cells with only unipolar modes of operation, the erase operations or generation of the erase state in the cells 100 and 120 operate to erase based predominately on a vector field such as an electric field. Because the erase state is based on an induced field, the memory cells 100, 120 can be erased with relatively low erase current of approximately less than 100 microamperes. The memory cell 100, 120 is configured therefore to reduce, eliminate or mitigate use of the Joule heating (ohmic heating) effects that normally dominate in erase operations for unipolar resistive switching memory cells.

Figure 2:
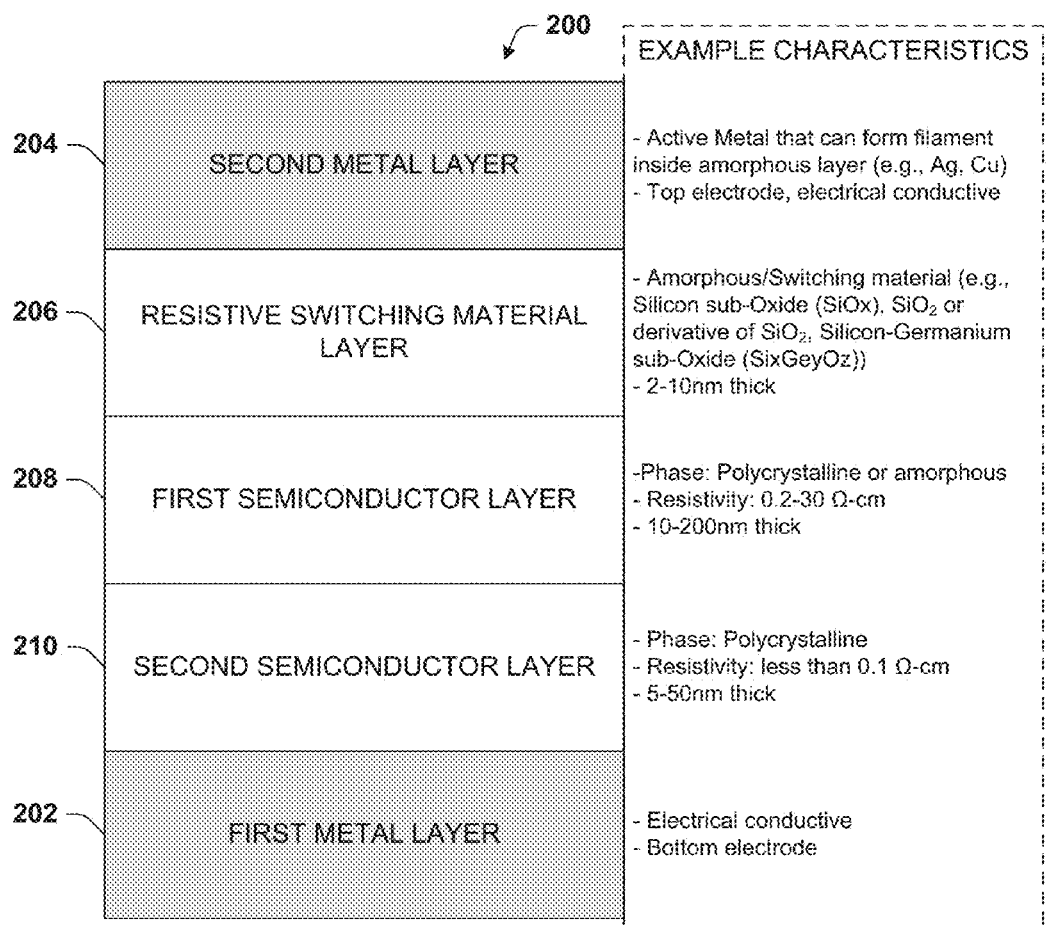
FIG. 2 illustrates a block diagram of another example of a memory cell that exhibits a dual mode of operation in accordance with certain embodiments of this disclosure.

Turning now to FIG. 2, a memory cell 200 is provided, which can be substantially similar to the memory cell 100 or 120, as discussed above. The memory cell 200 can include first metal layer 202 that can comprise a first electrical conductive metal and can operate as a bottom electrode, as noted in the callout of example characteristics. All such callout example characteristics as well as other detail included herein can relate to one or more embodiments of the disclosed subject matter and can exist for analogous layers associated with FIGS. 1A-1B.

The memory cell 200 can include second metal layer 204, which can operate as a top electrode, for example, and can be comprised of a second electrical conductive metal, which can be the same or different from the first electrical conductive metal. The memory cell 200 can also include resistive switching material layer 206 that can be situated between first metal layer 202 and second metal layer 204 and in some embodiments is adjacent to second metal layer 204. In various embodiments, resistive switching material layer 206 can be between 2 nanometers (nm) and 10 nm in thickness and can include a switching material that is an electrical insulator. For example, the switching material can include amorphous silicon, amorphous silicon germanium, silicon germanium sub-oxide ($Si_xGe_yO_z$), silicon dioxide ($SiO_2$) or a suitable derivative of silicon dioxide, silicon-on-glass (SOG), a solid electrolyte, or another suitable chalcogenide or oxide, including silicon sub-oxide, $SiO_x$, where x<2. In some embodiments, the switching material can be formed from an upper region of a p+ polycrystalline silicon or p+ silicon germanium bearing layer using a surface amorphization, thin film deposition, surface oxidation or the like.

Likewise, in some embodiments, second metal layer 204 can be an active metal such as, e.g., silver, copper, titanium, tungsten, aluminum, palladium, platinum, or some other active metal. An active metal can be characterized as a metal that diffuses into the switching material in response to an electric field. For instance, when a voltage differential exists between the two electrodes (e.g., an applied bias) of cell 200, then a current can flow between the two electrodes and an electric field can be created. In response to the electric field, the active metal of second metal layer 204 can drift or diffuse into resistive switching material layer 206, in some cases creating a conductive filament, which is further detailed with reference to FIG. 3 infra.

The memory cell 200 can include first semiconductor layer 208 that can be situated between first metal layer 202 and second metal layer 204 and adjacent to resistive switching material layer 206. The first semiconductor layer 208 can comprise a resistive layer that controls an On-state of current and can be comprised of a (lightly) doped semiconductor material. In the semiconductor domain, the process of doping is well-known and relates to the intentional addition of impurities into an otherwise extremely pure silicon semiconductor material. Such impurities are added in order to modify or modulate the electrical properties of the semiconductor according to a desired behavior, such as enabling a desired current or other electrical signal.

For example, in some embodiments, the lightly doped semiconductor material can be composed of silicon or a derivative of silicon and the outcome of the light or extrinsic doping can result in a resistivity of between about 0.2 ohm-centimeter (ohm-cm) to approximately 30 ohm-cm. It is understood that the resistivity of the lightly doped semiconductor material can be selected to meet a desired resistance of the device at the conductive state. The phase can be either polycrystalline or amorphous. In some embodiments, first semiconductor layer 208 can be between 10 nm and 200 nm in thickness, for example.

The memory cell 200 can also include second semiconductor layer 210 that can be situated between, as well as adjacent to, first semiconductor layer 208 and first metal layer 202. Second semiconductor layer 210 can be composed of a highly doped semiconductor material (e.g., a degenerate semiconductor) that operates as an ohmic contact layer, and be of the same doping type (either N or P type doping) as the first semiconductor layer 208. For example, in some embodiments, the highly doped semiconductor material can be composed of silicon or a derivative of silicon and the outcome of the high or degenerate doping can result in a resistivity of less than 0.1 ohm-cm. The second semiconductor layer 210 can operate to provide good or improved electrical connection between the first metal layer 202 and the first semiconductor layer 208. In some embodiments, the phase is polycrystalline, and the second semiconductor layer 210 can also be between 5 nm and 50 nm in thickness, for example. It is understood that the thicknesses provided herein are intended to be examples and not limiting. Other thicknesses for any of the various layers, should they be suitable, are also contemplated.

Figure 3:
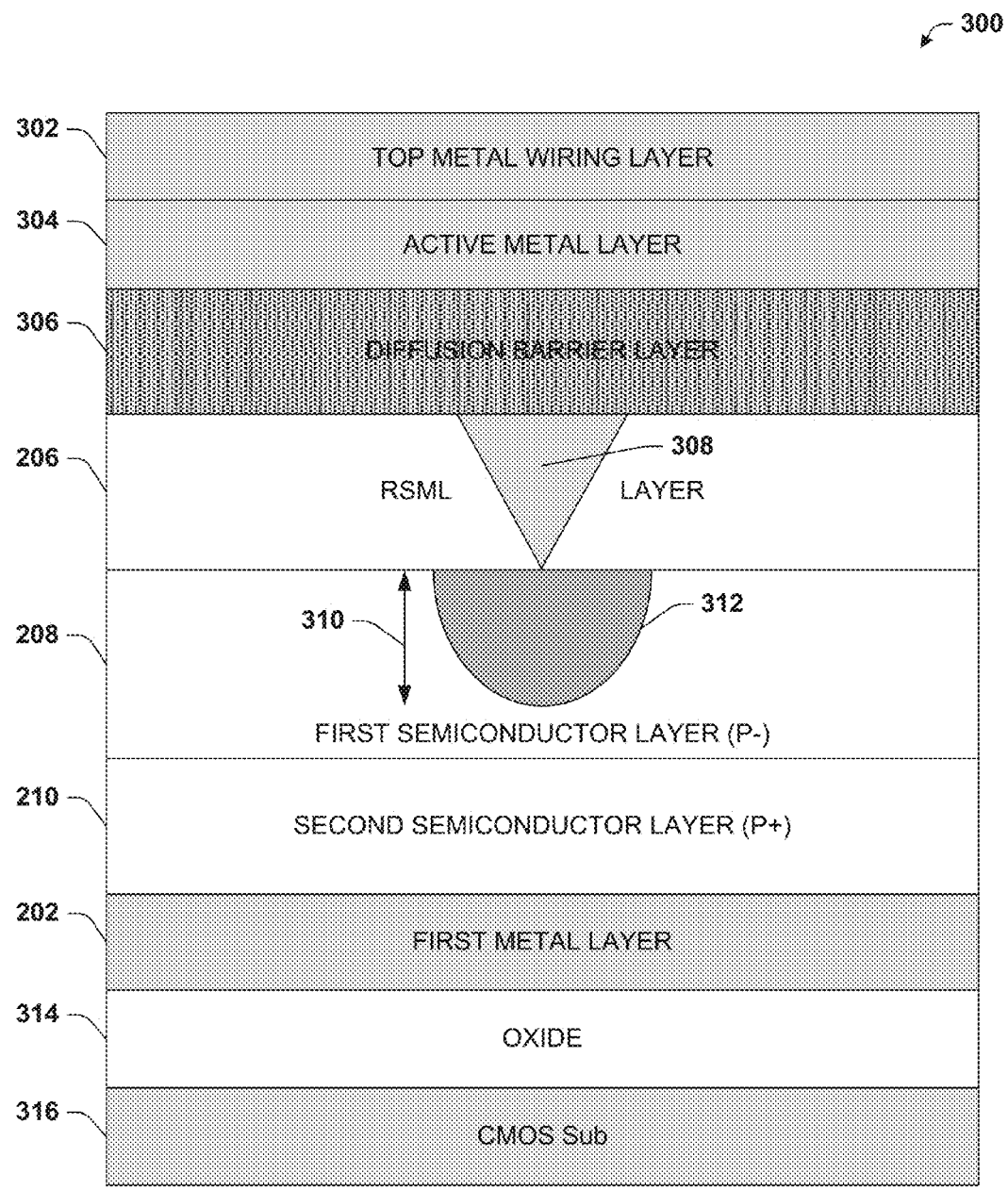
FIG. 3 illustrates a block diagram of a system that depicts additional aspects or detail in connection with a memory cell having a dual mode of operation in accordance with certain embodiments of this disclosure.

Referring now to FIG. 3, apparatus 300 is provided. A memory cell 300 illustrates example features associated with the memory cell 200. While this particular example employs memory device 200, it is understood that similar or identical features can exist for any of the aforementioned memory devices, 100, 120, or 200 as well.

In one example, the first electrode layer 102, the second metal layer 104, or the top metal layer 124, or the like convention can comprise two layers such as the top metal wiring layer 302 configured to provide an external contact to connect a signal from a signal source or conduction path (not shown) and an active metal layer 304 having ions (e.g., Ag) that mobilize in response to the signal.

In another embodiment, a contact layer (not shown) can be positioned between metal electrode layers (comprising the top metal wiring layer 302 and the active metal layer 304) and the resistive switching medium layer (RSML) as an electrically resistive diffusive layer 206. The contact layer can be configured, for instance, to improve physical or electrically continuity between electrically resistive diffusive layer 206 and metal electrode layers 302 and 304 (e.g., providing good continuity from electrically resistive diffusive layer 206, to a diffusion barrier layer 306, and to the electrode layers 302 and 304). The contact layer can be a doped silicon in some disclosed aspects (e.g., polysilicon, $Si_xGe_y$—where x and y are suitable positive integers).

In alternative or additional aspects of the subject disclosure, memory device 300 can comprise a diffusion barrier layer 306 between the active metal layer 304 and the switching medium 206. The barrier layer 306 can be configured to shield electrically resistive diffusive layer 206 from contaminants, oxygen, or the like. In a particular aspect, the diffusion barrier layer 306 can be formed from titanium, a titanium oxide, a titanium nitride, or a like compound, for example.

As discussed previously, the cell 300 can also comprise a unipolar mode of operation and a unipolar mode of operation for program and erase operations. The active metal layer 304 can comprise an active metal that diffuses into switching layer 206 when an electrical signal is applied, which is illustrated by diffusion region 308. When the active metal, which is a very good electrical conductor, enters the switching layer 206, the resistivity of the switching layer 206 becomes much lower than otherwise.

Depending on the magnitude, the polarity as well as the mode of operation for the cell 300 (bipolar modality and unipolar modality) of the electrical signal or bias, diffusion region 308 can exhibit different characteristics. For example, when an electrical signal such as a positive bias larger than a threshold (e.g., about 3V) is applied on the top electrode layers (the top metal wiring layer 302), a program event occurs and the cell 300 is placed into a program state. When the cell 300 is erased, a negative bias can be applied to the top metal layer 302, and as the bias increases from zero to minus two volts a decrease in current occurs and filament is removed from the device, thereby creating a larger resistance again within the switching layer 206. In bipolar mode of operation, applying positive bias causes the metal ions of the active metal layer 304 to be injected by electric field, for example. Because metal ions are positive, by applying a positive signal the metal ions (e.g., Ag) are injected into the switching medium 206 via the field strength.

To erase, a negative bias at the metal layers 302 attracts the metal ions from the switching layer 206 to the top electrode layer 302. However, in a unipolar mode because the switching layer 206 is thin, electrical breakdown can happen in the switching layer 206. As electrical breakdown is a localized effect (~10 nm range), large heat can be generated though Joule heating effect even at low breakdown current. This effect ultimately drives the metal to diffuse, thus, break down generates heat and derives the metal by heat to drive the ions. This is how the device or memory cell 300, for example, is programmed in a unipolar mode of operation. In other words, programming (injection of metal ions to the switching medium) is done by electric field for the bipolar mode whereas heat (diffusion) drives metal injection to the switching medium in the unipolar mode. In both unipolar and bipolar modes, the memory cell 300 can be erased by electric field (applying negative bias on the top electrode). Thus, unlike in other unipolar RRAMs or memory cells, the memory cell 300 can be erased and programmed based on an electric field, and erased with a relatively low erase current (e.g., about 100 microamperes).

The cell 300 operates differently according to different read, write (program) and erase operations. For example, in the presence of a read voltage that satisfies a read threshold (e.g., about 1 volt (V)) diffusion region 308 does not necessarily extend all the way through the switching layer 206. However, in the presence of a program voltage that satisfies a program threshold (e.g., approximately plus or minus 2.5 V) that is greater in magnitude than a read voltage, diffusion region 308 can include the filament or the conductive path that extends the entire thickness of the switching layer 206, effectively modifying the natural resistivity of the switching layer 206. Hence, once this filament is formed (e.g., by application of a program voltage), the resistance of the cell becomes lower relative to the case in which no filament has been formed.

If an erase voltage is applied (e.g., ~-2.5 V), then an opposite effect is observed. In that case, the active metal tends to retreat from resistive switching material layer 206 back toward the active metal layer 304. If, when the erase voltage was applied, a filament exists, then the filament is effectively dispersed and the resistance of the cell increases. Thus, application of a read voltage, which is not large enough to form a filament, will instead yield an indication of whether or not a filament already exists. If a filament already exists due to previous application of a program voltage, then a measure of the current through the cell will be higher than if no filament exists. Therefore, the filamentary state of the cell can be mapped to logical binary states.

A tester current compliance can be set to limit the maximum current to flow through the cell 300. Although the cell device is not a complementary metal-oxide semiconductor (CMOS), a CMOS or CMOS array could be controlling the device, such as in a current limiting circuit coupled to a semiconductor substrate layer 316 (e.g., a CMOS substrate) and coupled to the cell 300 via an oxide layer 314.

As described herein, the shortcomings of Joule heating associated with conventional techniques and architectures can be overcome or mitigated with the introduction of the first semiconductor layer 208 and, in some embodiments, with the second semiconductor layer 210. Because the first semiconductor layer 208 includes a lightly doped semiconductor material (e.g., extrinsic), the first semiconductor layer 208 can act as a built in resistor that prevents the cell from being too conductive when in the "on" or program state (e.g., when a filament has formed in diffusion region 302 or in a filamentary state).

For example, when a program voltage is applied to the cell, and a filament forms in switching medium 206, as this filament makes contact with first semiconductor layer 208, charge depletion region 312 can form. Charge depletion region 312 is a region that is depleted of mobile charges (e.g., an electron or a hole). Depth 310 associated with depletion region 312 can be a function of a voltage bias applied to the cell and the doping level of the first semiconductor layer 208. Thus, first semiconductor layer 208 can eliminate or reduce transient current or capacitive discharge current that can damage the cell and also eliminate the need for program cycles or other bias cycles to be managed according to timing schedules.

The memory cell 300 thereby provides flexibility by having programming and erase operations that are field programmable, in which both programming and erase can be based on a bipolar mode, a unipolar mode or a bipolar mode and unipolar mode. As such, a unipolar selection can operate to program and erase the cell with an absolute magnitude of an electrical signal, while a bipolar selection can operate to program and erase the cell based on an electric field of opposing polarities. Because of the different advantages to choose from, the circuit operation is not limited by a prefabricated mode of operation, or, in other words, a set bipolar mode or a set unipolar mode at manufacture, making the cells field programmable. As a bipolar cell, the device is is good for high speed programming/erase, and as a unipolar cell it is good for high density, because any diode can be placed in a series configured when in a unipolar mode. Normally with a pure bipolar device cell, difficulty arises when trying to integrate with a diode component or a p-n junction. The reason for this difficulty arises when a diode is only working in one direction, and, for example, the cell can be programmed, but not erased since a diode forces current in only one direction. Thus, for a bipolar device, it is hard to erase with a diode configuration since current is allowed to one side, which can affect circuit architecture.

However, the present memory cell 300 having dual operational modes of operation enables the cell to be field programmable as a logic device and as a memory device. For example, when building a memory array with a bipolar cell, a portion of memory can be with a diode and a portion not with a diode normally, depending upon design parameters. If a diode or a p-n junction is added, the memory cell 300 in a unipolar mode is very compatible. Thus, different circuit design choices can result from the memory cell 300 having both unipolar and bipolar modes of operation, since it can be programmed in different ways. If cell 300 is in the On-state, with two transistors, for example, then a memory device can be configured with a connection between resistors. The device 300 can operate to serve as a memory or a logic device, in which the advantages come from having different operational voltages, and also that the cell 300 can be positive, negative or ground, which makes it suitable for logic and coupling to a diode component or p-n junction.

Figure 4:
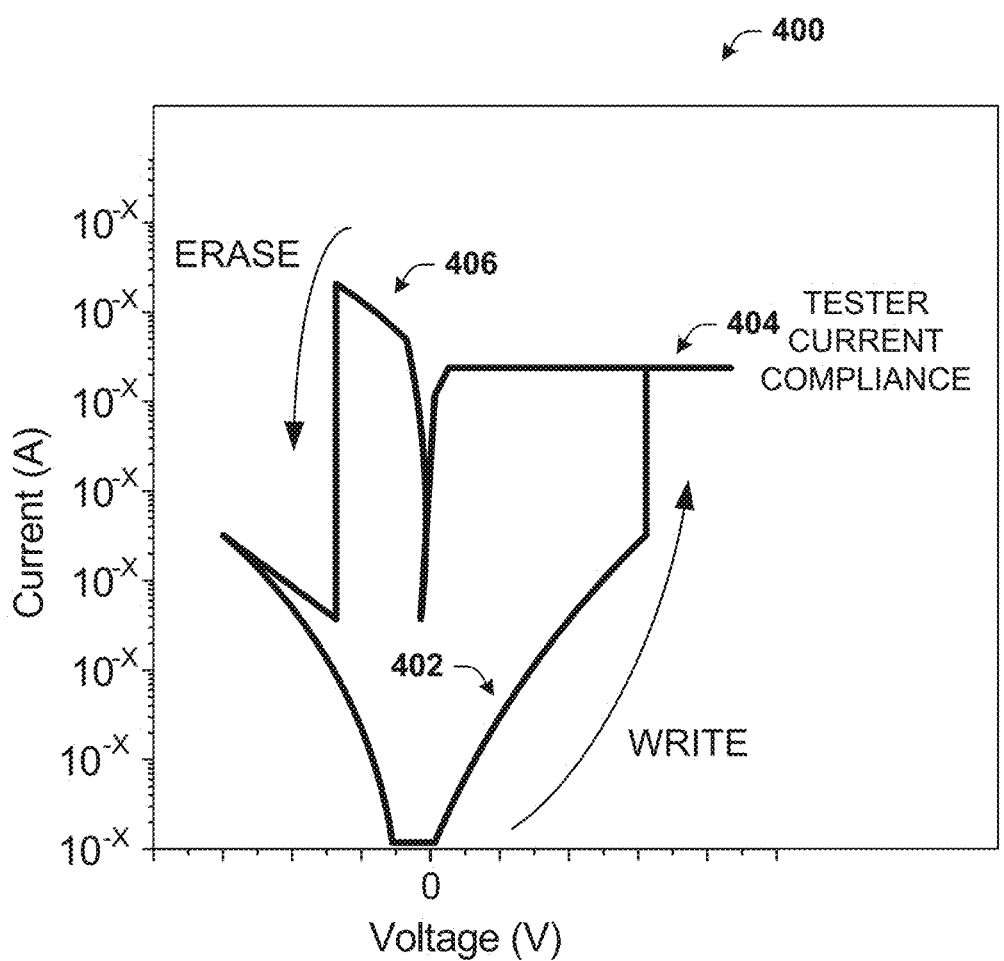
FIG. 4 illustrates an example graph of current versus voltage for an example memory cell that operates in accordance with certain embodiments of this disclosure.

With reference now to FIG. 4, illustrated is a graph 400 of current versus voltage for an example RRAM cell having a dual mode of operation comprising a bipolar mode and a unipolar mode of operation, which operates in the bipolar mode. When operating in the bipolar mode, a program (write) signal (e.g., a voltage) can be applied, as depicted as a program behavior plot 402 on the right side of the graph, and the filament forms once a threshold (e.g., about 3-4V) is satisfied. A tester current compliance 404 can be present to limit the maximum current that flows through the device, in which a CMOS device can control the cell, such as in a current limiting circuit, for example. When current is swept back to zero, the resistance is effectively reduced in the program state. An erase operation is depicted at the portion of the erase plot 406 located at the left side of the graph 400. For example, when an erase voltage is applied with a negative bias, from zero to minus two volts there is a decrease in current and the filament or conductive path is removed from the device, resulting in a larger resistance again.

Figure 5:
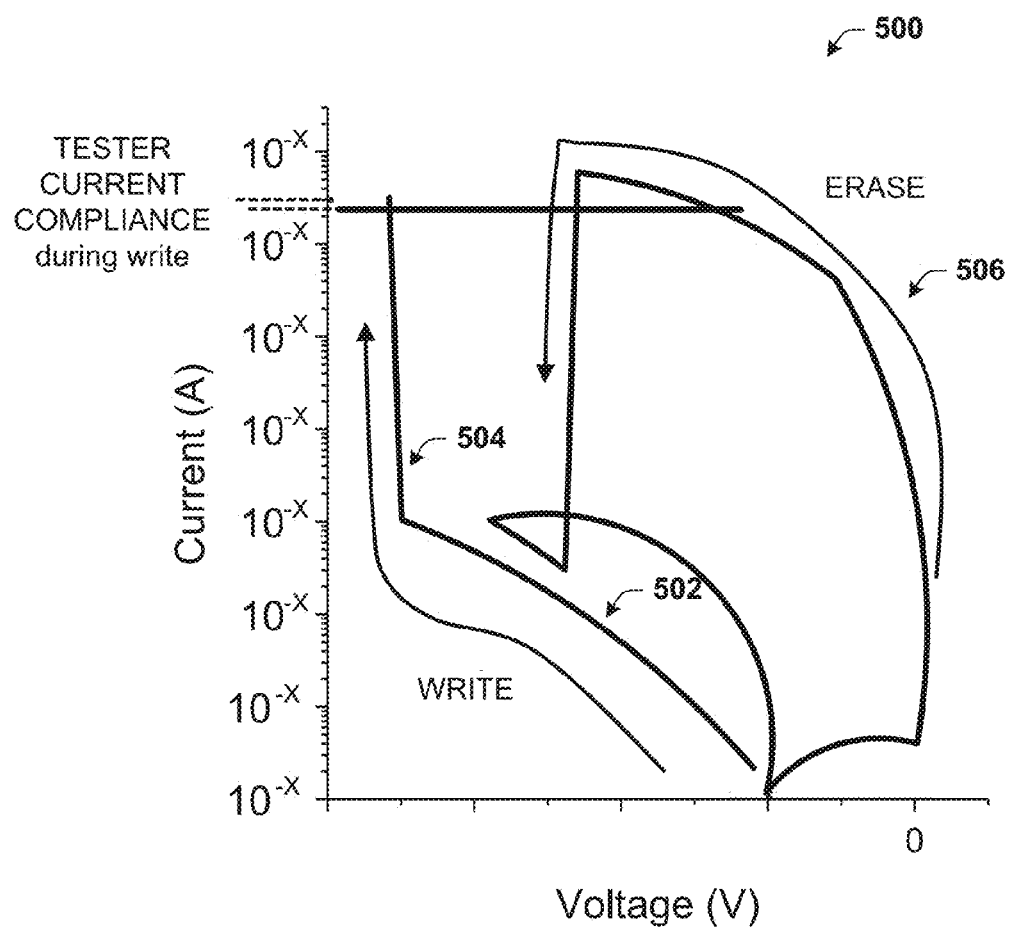
FIG. 5 illustrates an example graph of current versus voltage for an example memory cell that operates in accordance with certain embodiments of this disclosure.

Referring now to FIG. 5, illustrated is an example graph 500 of current versus voltage for an example RRAM cell having a dual mode of operation comprising a bipolar mode and a unipolar mode of operation, which operates in the unipolar mode. Instead of applying positive and negative electrical signals of different polarities, the cell can additionally operate with an absolute magnitude of the signal and be programmed and erased based on the magnitude rather than polarity.

For example, a program (write) behavior plot 502 is illustrated on the left side in the direction of the write arrow. By an application of a negative bias larger than a threshold (e.g., 3 to about 6V) on the top electrode or active metal layer, the bias will cause an electrical breakdown as a non-linear response 504 of the resistive and switching layers discussed above, which causes a localized effect. This localized effect is characterized by a rise in local current density and local heating injects metal ions into the switching layer of the cell. During the programming operations, a current compliance, as discussed above, can be applied to limit the excess heating that can occur. Furthermore, the resistive layer (non-metallic layer) can prevent the filaments from making metal (filament) to metal contact between the electrode layer on opposite sides of the first and second surfaces of the switching layer.

In the erase operation in the unipolar mode of operation, the cell receives a negative bias that is not larger than the write or program bias. The electric field generated pulls back the injected metal particles, rupturing the conducting filament or path forming the Off-state or erase state. Unlike other devices that are only unipolar, the erase operation is based on the electric field predominately and can be erased with a relatively low erase current (e.g., about 100 microamperes). Therefore, the memory cells herein can behave according to both bipolar and unipolar modes of operation as illustrated in FIGS. 4 and 5 enabling more functionality to the RRAM cell for both memory and logic applications, more compact arrays and flexibility to circuit designs.

Figure 6:
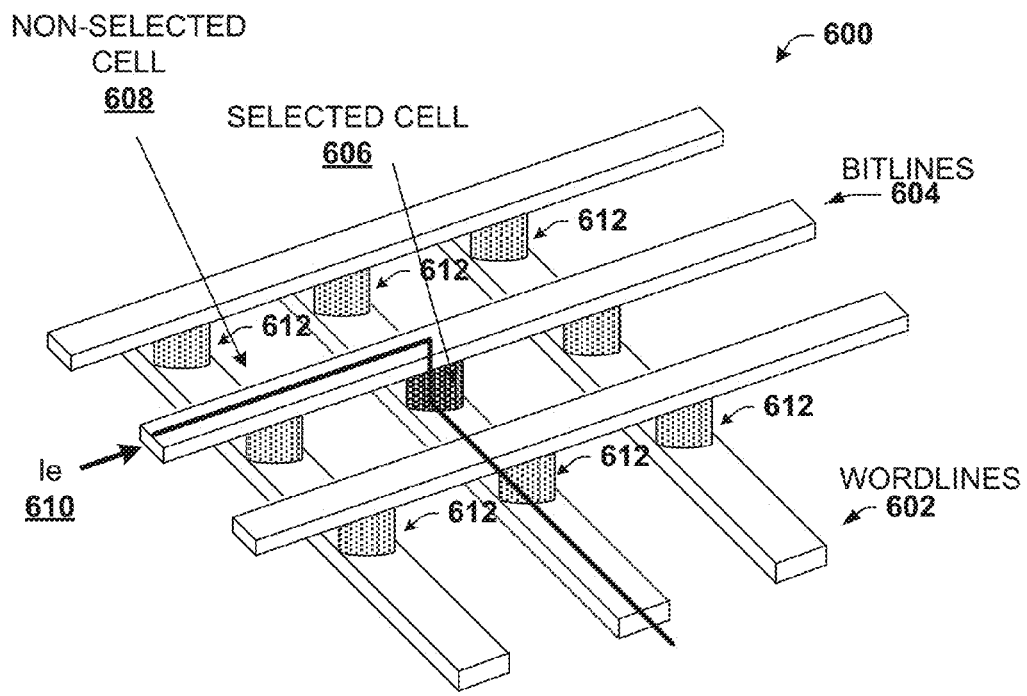
FIG. 6 illustrates a diagram of an example memory comprising an architecture of a crossbar array of memory cells in accordance with certain embodiments of this disclosure.

Turning now to FIG. 6, system 600 is depicted. System 600 is an example memory comprising an architecture of an array of RRAM cells. System 600 is used to illustrate an array of RRAM cells that can operate in dual modes of operation, in which memory cells proximate or adjacent to one another in the array can be programmed and erased in different modes, and then subsequently be programmed and erased in another mode. In both cases, system 600 includes various wordlines 602 and bitlines 604 in which a single cell among the array can be selected based upon an applied bias between a particular wordline 602 and a particular bitline 604 with the selected cell 606 representing the junction. In other embodiments, cells may be arranged vertically.

In one example, the selected cell 606 is erased in a bipolar mode according to an electrical signal (e.g., Ie) applied across an electrode of the cell, and is configured to generate the erase state of the conductive path based on an electrical signal that has an inverse polarities to a program state of the cell. The selected cell 606, for example, can be programmed with a positive signal while erased with an electrical signal or voltage of an opposite polarity. The selected cell can then be programmed and erased as a unipolar cell, in which polarities are the same for the program and erase operations, and the magnitude of the electrical signal or voltage for the operation operates as the only variable to determining an erase or a program event. In both modes of operation (bipolar and unipolar), the selected cell 606 operates to be erased according to an electric field that ruptures the conductive filament therein, while programming results from an electric field applied in the bipolar mode and from Joule heating effects in the unipolar mode.

In addition or alternatively, one or more of the neighboring cell(s) 612 can be selected and programmed and erased as unipolar cells while the selected cell 606 is programmed and erased as a bipolar cell, and vice versa. The selected cell 606 can then be programmed and erased according to a unipolar mode of operation and any one of the neighboring cells of the array in the bipolar mode of operation. Therefore, the modes of the memory cells within the array are not fixed and any array of dual mode RRAMs can be field programmable to program and erase based on different modes of operation within each cell according to a desired, programmed or processor controlled setting.

Example Methods for RRAM with Dual Mode Operation

The aforementioned diagrams have been described with respect to interaction between several components, or memory architectures. It should be appreciated that such diagrams can include those components and architectures specified therein, some of the specified components/architectures, or additional components/architectures. Sub-components can also be implemented as electrically connected to other sub-components rather than included within a parent architecture. Additionally, it is noted that one or more disclosed processes can be combined into a single process providing aggregate functionality. For instance, a program process can comprise an erase process, or vice versa, to facilitate programming and erasing a semiconductor cell by way of a single process. In addition, it should be appreciated that respective rows of disclosed memory architectures can be erased in groups (e.g., multiple rows erased concurrently) or individually. Moreover, it should be appreciated that multiple RRAM cells on a particular row can be programmed in groups (e.g., multiple RRAM cells programmed concurrently) or individually. Components of the disclosed architectures can also interact with one or more other components not specifically described herein but known by those of skill in the art.

In view of the exemplary diagrams described supra, process methods that can be implemented in accordance with the disclosed subject matter will be better appreciated with reference to the flow charts illustrated. While for purposes of simplicity of explanation, the methods shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 7:
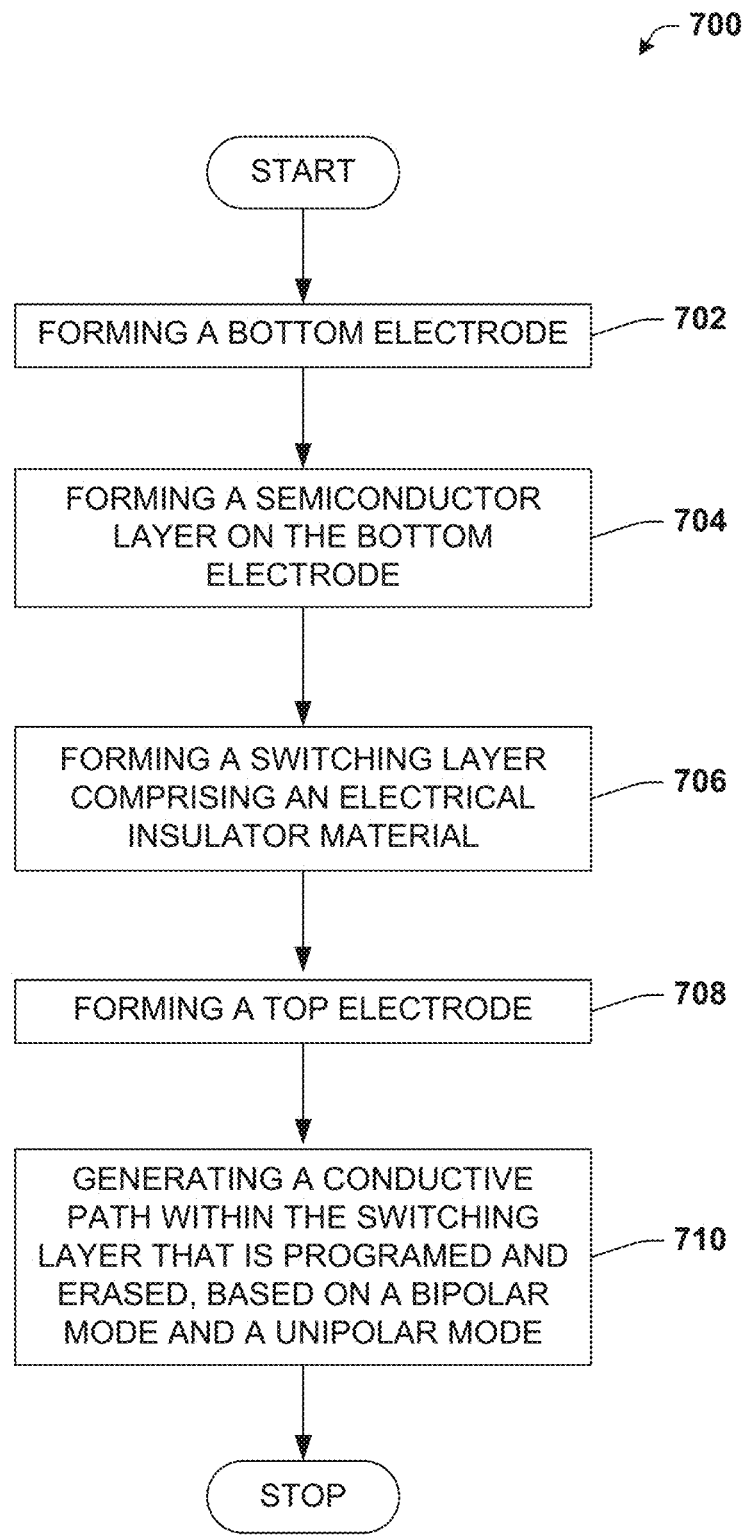
FIG. 7 illustrates an example methodology that can provide for fabricating a memory cell in accordance with certain embodiments of this disclosure.

FIG. 7 illustrates exemplary method 700. Method 700 can provide for fabricating a resistive random access memory (RRAM) cell having a dual mode of operation. The RRAM cell according to method 700 can operate with a dual mode of operation comprising a bipolar mode and a unipolar mode that controls the programming and erasing operations of the cell.

At 702, a bottom electrode is formed to provide an electrical contact. For example, a bottom electrode layer can be disposed on an oxide layer of a semiconductor substrate as discussed in detail above.

At 704, a semiconductor layer can be formed between at least one electrode of the plurality of electrodes and the switching layer. In another embodiment, the semiconductor layer can comprise a resistive layer to control current during programming or an ohmic contact layer, in which both are of the same doping type as one another (e.g., p-type doping or n-type doping).

At 706, a switching layer can be disposed on the semiconductor layer, and comprises an electrical insulator material that has a greater resistance than the electrodes. The switching layer can comprise a passive switching layer that includes titanium oxide, for example, to provide an oxygen diffusion barrier, as well as comprise an active switching layer comprising a silicon oxide, for example, for filament formation.

At 708, a top electrode can be disposed on the switching layer to provide an external connection. In one example, the top electrode can comprise a metal wiring layer for an external connection and an active layer having ions (e.g., Ag) that are in part mobile into a resistive switching medium of a switching layer.

At 710, a conductive path is generated within the switching layer that can be programmed in a program state and erased in an erase state, based on a bipolar mode that generates the program state and the erase state in the conductive path, and on a unipolar mode that generates the program state and the erase state in the conductive path.

Figure 8:
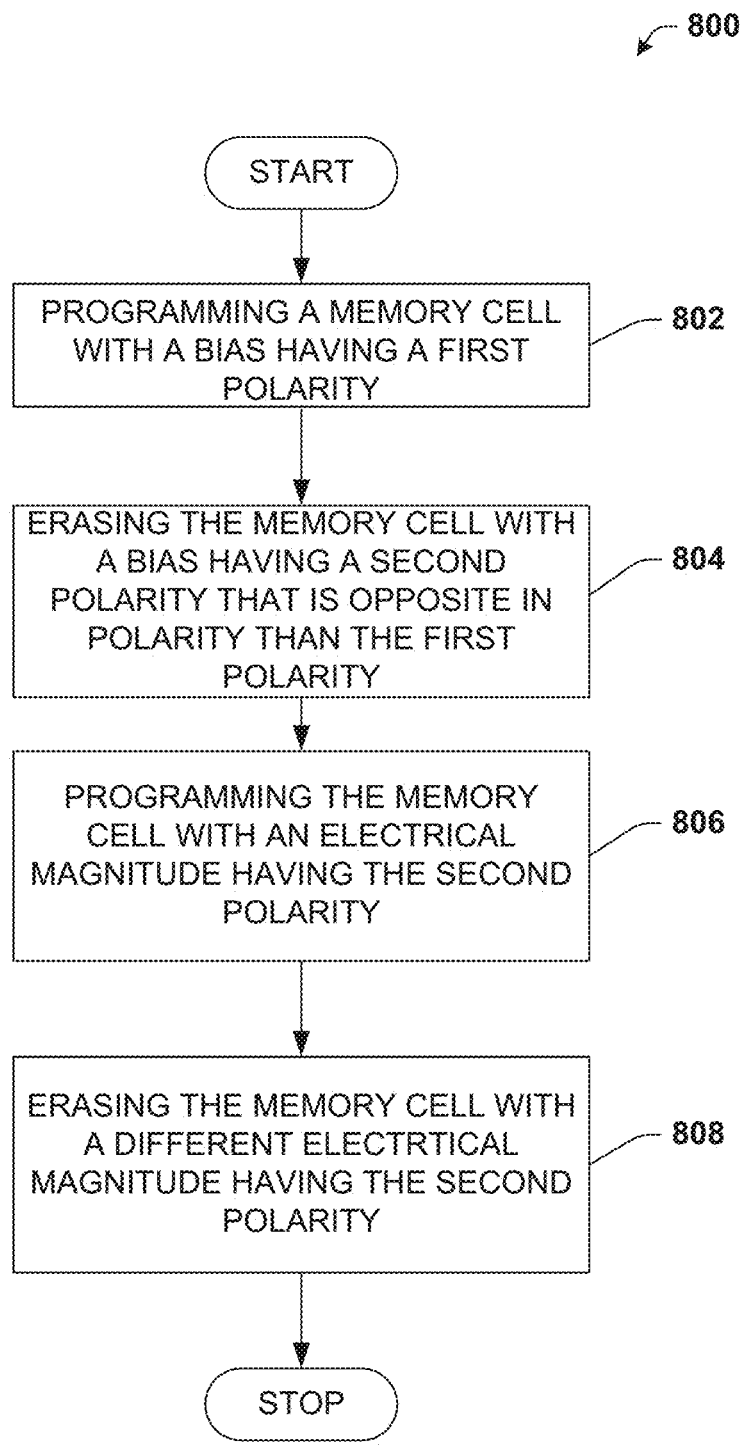
FIG. 8 illustrates an example methodology that can provide for operating a memory cell in accordance with certain embodiments of this disclosure.

Referring now to FIG. 8, illustrates a method 800 for operating a memory cell having dual modes of operation (a bipolar operating mode and a unipolar operating mode). At 802, the memory cell is programmed by forming a conductive filament that decreases the resistance of the switching medium with an electrical signal or bias that has a first polarity (e.g., about 3V). At 804, the same memory cell is erased with an electrical signal or a bias having a different polarity or an opposite polarity than the programming bias. At 806, the memory cell can be programmed according to a magnitude of an electrical signal or bias, which can have the same polarity as the erasing operation at 804. At 808, the cell can be erased with a different magnitude that also has the same polarity as the erasing operation at 804 and the programming operation at 806. No one particular order of acts herein is limiting and any combination of the acts can be envisioned that are discussed in relation to the memory cell referenced.

Example Operating Environments

Figure 9:
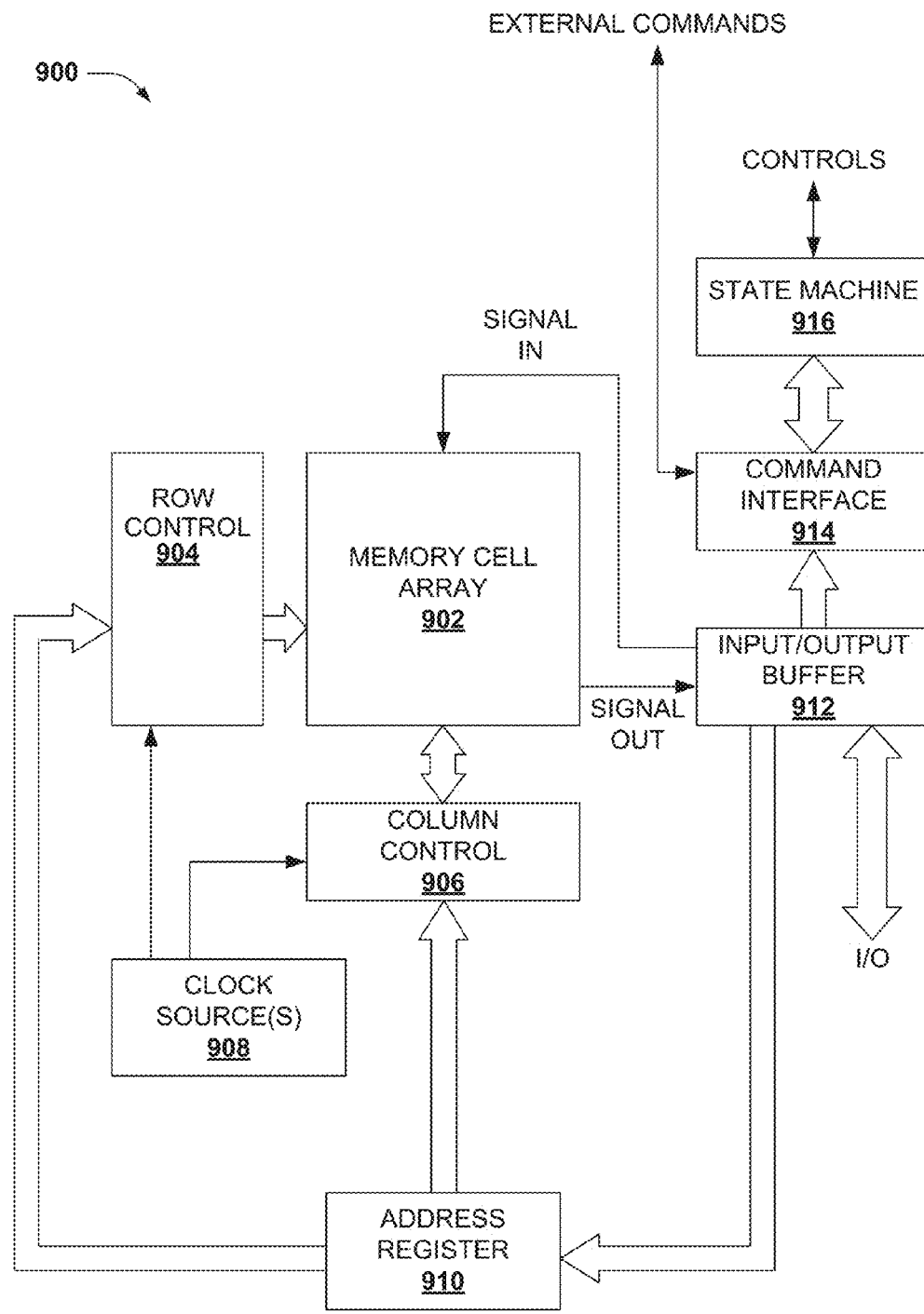
FIG. 9 illustrates a block diagram of an example electronic operating environment in accordance with certain embodiments of this disclosure.

In order to provide a context for the various aspects of the disclosed subject matter, FIG. 9, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, USB memory device, or the like. In a distributed computing environment, program modules can be located in both local and remote memory storage devices.

FIG. 9 illustrates a block diagram of an example operating and control environment 900 for a RRAM array 902 according to aspects of the subject disclosure. In at least one aspect of the subject disclosure, RRAM array 902 can comprise a variety of RRAM memory cell technology. Particularly, RRAM array can be configured or operated to mitigate or avoid sneak path currents of the RRAM array, as described herein.

A column controller 906 can be formed adjacent to RRAM array 902. Moreover, column controller 906 can be electrically coupled with bit lines of RRAM array 902. Column controller 906 can control respective bitlines, applying suitable program, erase or read voltages to selected bitlines.

In addition, operating and control environment 900 can comprise a row controller 904. Row controller 904 can be formed adjacent to column controller 906, and electrically connected with word lines of RRAM array 902. Row controller 904 can select particular rows of memory cells with a suitable selection voltage. Moreover, row controller 904 can facilitate program, erase or read operations by applying suitable voltages at selected word lines.

A clock source(s) 908 can provide respective clock pulses to facilitate timing for read, write, and program operations of row control 904 and column control 906. Clock source(s) 908 can further facilitate selection of word lines or bit lines in response to external or internal commands received by operating and control environment 900. An input/output buffer 912 can be connected to an external host apparatus, such as a computer or other processing device (not depicted) by way of an I/O buffer or other I/O communication interface. Input/output buffer 912 can be configured to receive write data, receive an erase instruction, output readout data, and receive address data and command data, as well as address data for respective instructions. Address data can be transferred to row controller 904 and column controller 906 by an address register 910. In addition, input data is transmitted to RRAM array 902 via signal input lines, and output data is received from RRAM array 902 via signal output lines. Input data can be received from the host apparatus, and output data can be delivered to the host apparatus via the I/O buffer.

Commands received from the host apparatus can be provided to a command interface 914. Command interface 914 can be configured to receive external control signals from the host apparatus, and determine whether data input to the input/output buffer 912 is write data, a command, or an address. Input commands can be transferred to a state machine 916.

State machine 916 can be configured to manage programming and reprogramming of RRAM array 902. State machine 916 receives commands from the host apparatus via input/output interface 912 and command interface 914, and manages read, write, erase, data input, data output, and like functionality associated with RRAM array 902. In some aspects, state machine 916 can send and receive acknowledgments and negative acknowledgments regarding successful receipt or execution of various commands.

To implement read, write, erase, input, output, etc., functionality, state machine 916 can control clock source(s) 908. Control of clock source(s) 908 can cause output pulses configured to facilitate row controller 904 and column controller 906 implementing the particular functionality. Output pulses can be transferred to selected bit lines by column controller 906, for instance, or word lines by row controller 904, for instance.

In connection with FIG. 10, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 10:
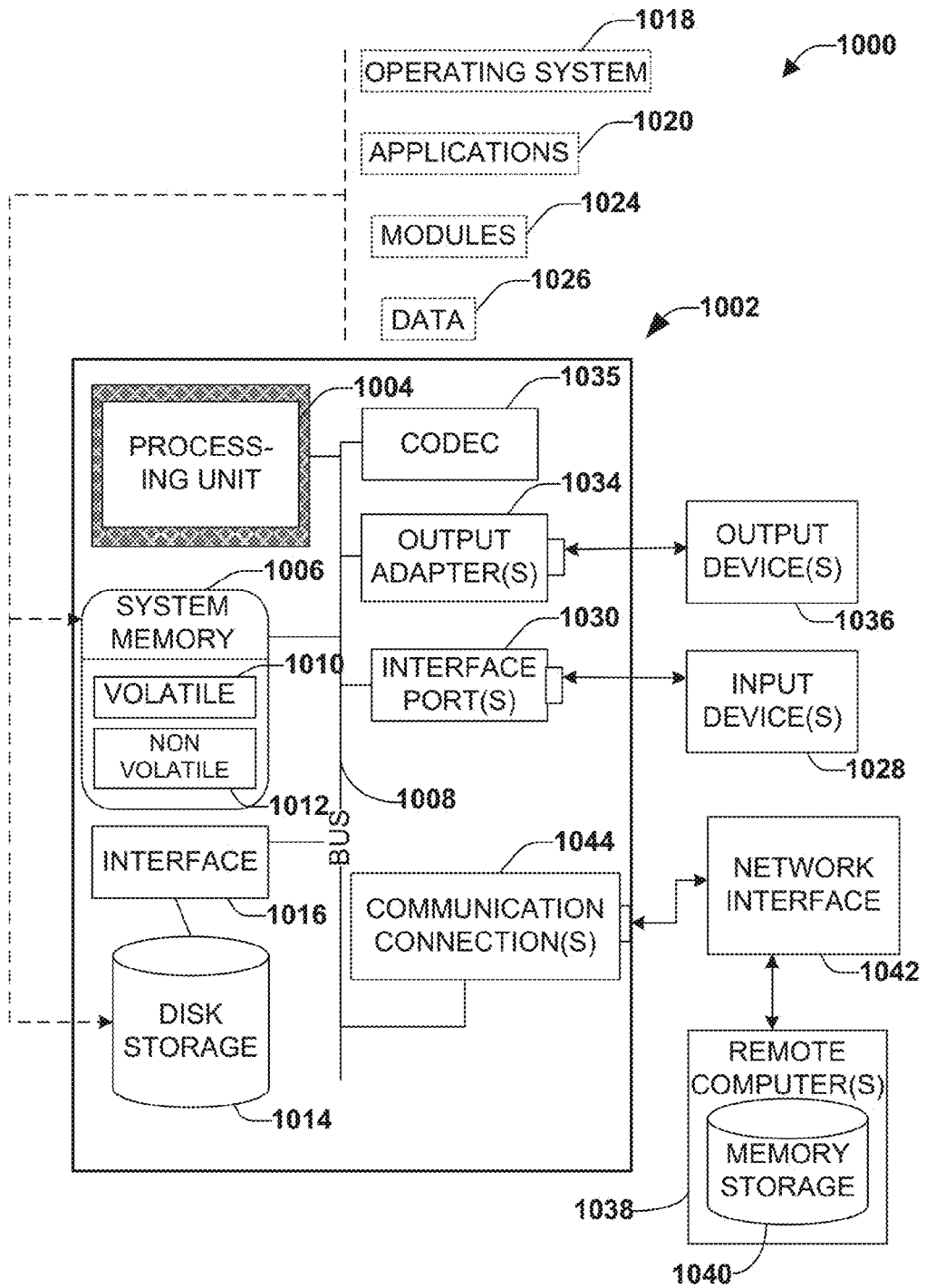
FIG. 10 illustrates an example schematic block diagram for a computing environment in accordance with certain embodiments of this disclosure.

With reference to FIG. 10, a suitable environment 1000 for implementing various aspects of the claimed subject matter includes a computer 1002. The computer 1002 includes a processing unit 1004, a system memory 1006, a codec 1035, and a system bus 1008. The system bus 1008 couples system components including, but not limited to, the system memory 1006 to the processing unit 1004. The processing unit 1004 can be any of various available processors. Dual microprocessors and other multiprocessor architectures also can be employed as the processing unit 1004.

The system bus 1008 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1006 includes volatile memory 1010 and non-volatile memory 1012. The basic input/output system (BIOS), containing the basic routines to transfer information between elements within the computer 1002, such as during start-up, is stored in non-volatile memory 1012. In addition, according to present innovations, codec 1035 may include at least one of an encoder or decoder, wherein the at least one of an encoder or decoder may consist of hardware, software, or a combination of hardware and software. Although, codec 1035 is depicted as a separate component, codec 1035 may be contained within non-volatile memory 1012. By way of illustration, and not limitation, non-volatile memory 1012 can include read only memory (ROM), programmable ROM (PROM), electrically programmable ROM (EPROM), electrically erasable programmable ROM (EEPROM), or flash memory. Volatile memory 1010 includes random access memory (RAM), which acts as external cache memory. According to present aspects, the volatile memory may store the write operation retry logic (not shown in FIG. 10) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM.

Computer 1002 may also include removable/non-removable, volatile/non-volatile computer storage medium. FIG. 10 illustrates, for example, disk storage 1014. Disk storage 1014 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1014 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1014 to the system bus 1008, a removable or non-removable interface is typically used, such as interface 1016. It is appreciated that storage devices 1014 can store information related to a user. Such information might be stored at or provided to a server or to an application running on a user device. In one embodiment, the user can be notified (e.g., by way of output device(s) 1036) of the types of information that are stored to disk storage 1014 or transmitted to the server or application. The user can be provided the opportunity to opt-in or opt-out of having such information collected or shared with the server or application (e.g., by way of input from input device(s) 1028).

It is to be appreciated that FIG. 10 describes software that acts as an intermediary between users and the basic computer resources described in the suitable operating environment 1000. Such software includes an operating system 1018. Operating system 1018, which can be stored on disk storage 1014, acts to control and allocate resources of the computer system 1002. Applications 1020 take advantage of the management of resources by operating system 1018 through program modules 1024, and program data 1026, such as the boot/shutdown transaction table and the like, stored either in system memory 1006 or on disk storage 1014. It is to be appreciated that the claimed subject matter can be implemented with various operating systems or combinations of operating systems.

A user enters commands or information into the computer 1002 through input device(s) 1028. Input devices 1028 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1004 through the system bus 1008 via interface port(s) 1030. Interface port(s) 1030 include, for example, a serial port, a parallel port, a game port, and a universal serial bus (USB). Output device(s) 1036 use some of the same type of ports as input device(s) 1028. Thus, for example, a USB port may be used to provide input to computer 1002 and to output information from computer 1002 to an output device 1036. Output adapter 1034 is provided to illustrate that there are some output devices 1036 like monitors, speakers, and printers, among other output devices 1036, which require special adapters. The output adapters 1034 include, by way of illustration and not limitation, video and sound cards that provide a means of connection between the output device 1036 and the system bus 1008. It should be noted that other devices or systems of devices provide both input and output capabilities such as remote computer(s) 1038.

Computer 1002 can operate in a networked environment using logical connections to one or more remote computers, such as remote computer(s) 1038. The remote computer(s) 1038 can be a personal computer, a server, a router, a network PC, a workstation, a microprocessor based appliance, a peer device, a smart phone, a tablet, or other network node, and typically includes many of the elements described relative to computer 1002. For purposes of brevity, only a memory storage device 1040 is illustrated with remote computer(s) 1038. Remote computer(s) 1038 is logically connected to computer 1002 through a network interface 1042 and then connected via communication connection(s) 1044. Network interface 1042 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1044 refers to the hardware/software employed to connect the network interface 1042 to the bus 1008. While communication connection 1044 is shown for illustrative clarity inside computer 1002, it can also be external to computer 1002. The hardware/software necessary for connection to the network interface 1042 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical or magnetic signals capable of being stored, transferred, combined, compared, or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts or events of the various processes.

What is claimed is:

1. An electronic device comprising an electronic memory unit, the electronic memory unit comprising one or more two-terminal multi-state memory cells configured to store information, the two-terminal multi-state memory cells comprising:
   a pair of electrodes respectively configured to conduct a current at a first electrical resistance;
   an insulating switching medium positioned between the pair of electrodes and configured to conduct the current at a second electrical resistance that is different than the first electrical resistance; and
   a conductive filament configured to form and to rupture within at least a portion of the insulating switching medium in response to a bipolar mode of operation and in response to a unipolar mode of operation, wherein the conductive filament, when formed, causes the insulating switching medium to conduct the current at less than the second electrical resistance, and wherein the conductive filament, when ruptured, causes the insulating switching medium to conduct the current at substantially the second electrical resistance.

2. The electronic device of claim 1, wherein the bipolar mode of operation comprises a formation and a rupturing of the conductive filament as a function of a physical force of a vector field.

3. The electronic device of claim 1, wherein the unipolar mode of operation comprises a formation and a rupturing of the conductive filament as a function of a physical force of a vector field in combination with an ohmic heating stimulus.

4. The electronic device of claim 1, the two-terminal multi-state memory cells further comprising:
   a semiconductor substrate;
   an oxide layer disposed on the semiconductor substrate;
   a bottom metal electrode of the pair of electrodes disposed on the oxide layer; and
   an ohmic contact layer disposed on the bottom metal electrode.

5. The electronic device of claim 4, the two-terminal multi-state memory cells further comprising a resistive layer disposed on the ohmic contact layer that controls the current from a program state of the conductive filament.

6. The electronic device of claim 5, wherein the ohmic contact layer and the resistive layer comprise a first semiconductor material and a second semiconductor material both having either an n-type doping or a p-type doping.

7. The electronic device of claim 5, wherein the resistive layer is configured to provide a resistivity of between about 0.2 ohm-centimeter and about 20 ohm-centimeter between the ohmic contact layer and the switching layer.

8. The electronic device of claim 4, wherein the ohmic contact layer is configured to provide a resistivity of about 0.1 ohm-centimeters or less between the first metal wiring layer and the resistive layer.

9. The electronic device of claim 4, wherein the two-terminal multi-state memory cells further comprise a diffusion barrier layer disposed on the insulating switching medium.

10. The electronic device of claim 9, wherein the two-terminal multi-state memory cells further comprise a top metal electrode disposed on the diffusion barrier layer.

11. The electronic device of claim 10, wherein the top metal electrode comprises:
    an active metal material that is disposed over the diffusion barrier layer and having ions comprising copper, aluminum or a noble metal, that are at least in part mobile within the insulating switching medium; and
    a metal wiring material disposed over the active metal layer.

12. The electronic device of claim 4, further comprising:
    at least one of a set of complementary metal-oxide semiconductor (CMOS) devices formed within or on the semiconductor substrate or a diode component formed within or on the semiconductor substrate.

13. A method for programming a memory cell, comprising:
    activating a memory cell of an array of memory cells;
    receiving a selection indicative of a program mode, the program mode selected from a group consisting of: a unipolar program mode and a bipolar program mode; and at least one of:

applying a first stimulus to the memory cell in response to the selection being indicative of the bipolar mode, the first stimulus being configured to program the memory cell from a high resistance state to a low resistance state; or applying a second stimulus to the memory cell in response to the selection being indicative of the unipolar mode, the second stimulus being configured to program the memory cell from the high resistance state to a second low resistance state.

14. The method of claim 13, wherein the second low resistance state is substantially the same as the low resistance state.

15. The method of claim 13, wherein applying the first stimulus further comprises applying a positive voltage inducing an electric field of a first bias onto the memory cell, the electric field being configured to form a conductive path through a switching layer of the memory cell.

16. The method of claim 13, wherein applying the second stimulus further comprises applying a negative voltage configured to induce electrical breakdown and joule heating within a switching layer of the memory cell, forming a conductive path through the switching layer.

17. The method of claim 13, further comprising receiving a second selection indicative of an erase command for the memory cell.

18. The method of claim 17, further comprising activating the memory cell of the array of memory cells and applying a third stimulus configured to erase the memory cell from the low resistance state to the high resistance state, and configured to erase the memory cell from the second low resistance state to the high resistance state.

19. The method of claim 18, wherein applying the third stimulus further comprises applying a negative voltage to the memory cell.

20. The method of claim 19, wherein applying the third stimulus further comprises applying the negative voltage with a smaller magnitude than associated with the second stimulus.

* * * * *